United States Patent
McShane et al.

(10) Patent No.: US 10,168,904 B2
(45) Date of Patent: Jan. 1, 2019

(54) QUASI-ERROR NOTIFICATIONS IN A DISPERSED STORAGE NETWORK

(71) Applicant: International Business Machines Corporation, Armonk, NY (US)

(72) Inventors: Niall J. McShane, Arlington Heights, IL (US); Jason K. Resch, Chicago, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/457,408

(22) Filed: Mar. 13, 2017

(65) Prior Publication Data

US 2017/0185303 A1    Jun. 29, 2017

Related U.S. Application Data

(63) Continuation-in-part of application No. 15/058,408, filed on Mar. 2, 2016.
(Continued)

(51) Int. Cl.
*G06F 3/06* (2006.01)
*G06F 11/10* (2006.01)
(Continued)

(52) U.S. Cl.
CPC ............ *G06F 3/0604* (2013.01); *G06F 3/064* (2013.01); *G06F 3/067* (2013.01); *G06F 3/0619* (2013.01);
(Continued)

(58) Field of Classification Search
CPC ...... G06F 3/0604; G06F 3/0619; G06F 3/064; G06F 3/0644; G06F 3/0659; G06F 3/067;
(Continued)

(56) References Cited

U.S. PATENT DOCUMENTS 4,092,732 A    5/1978    Ouchi
5,454,101 A    9/1995    Mackay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — Kyle Vallecillo
(74) *Attorney, Agent, or Firm* — Garlick & Markison; Timothy W. Markison; Harry S. Tyson, Jr.

(57) ABSTRACT

Methods for use in a dispersed storage network (DSN) to retrieve encoded data from memory device of an impaired storage unit. In various examples, a computing device of the DSN issues requests to a plurality of storage units, including the impaired storage unit, to recover at least a decode threshold number of encoded data slices of a set of encoded data slices. When the impaired storage unit determines that it is not able to quickly retrieve the requested data slice for provision to the computing device, the impaired storage unit promptly issues a quasi-error response instead. When the computing device receives less than the decode threshold number of encoded data slices and a quasi-error response, it may elect to issue another slice request(s) to another storage unit(s) and/or issue a continue request instructing the impaired storage unit to continue processing the request to recover the data slice stored therein.

20 Claims, 6 Drawing Sheets

Related U.S. Application Data

(60) Provisional application No. 62/154,886, filed on Apr. 30, 2015.

(51) Int. Cl.
    *H03M 13/15*     (2006.01)
    *H03M 13/00*     (2006.01)

(52) U.S. Cl.
    CPC .......... *G06F 3/0644* (2013.01); *G06F 3/0659* (2013.01); *G06F 11/1076* (2013.01); *G06F 11/1092* (2013.01); *G06F 2211/1028* (2013.01); *H03M 13/1515* (2013.01); *H03M 13/616* (2013.01)

(58) Field of Classification Search
    CPC ............. G06F 11/1076; G06F 11/1092; G06F 2211/1028; H03M 13/1515; H03M 13/616
    See application file for complete search history.

(56) References Cited

U.S. PATENT DOCUMENTS

| | | | |
|---|---|---|---|
| 5,485,474 A | 1/1996 | Rabin | |
| 5,774,643 A | 6/1998 | Lubbers et al. | |
| 5,802,364 A | 9/1998 | Senator et al. | |
| 5,809,285 A | 9/1998 | Hilland | |
| 5,890,156 A | 3/1999 | Rekieta et al. | |
| 5,987,622 A | 11/1999 | Lo Verso et al. | |
| 5,991,414 A | 11/1999 | Garay et al. | |
| 6,012,159 A | 1/2000 | Fischer et al. | |
| 6,058,454 A | 5/2000 | Gerlach et al. | |
| 6,128,277 A | 10/2000 | Bruck et al. | |
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 | 5/2007 | Raipurkar et al. | |
| 7,240,236 B2 | 7/2007 | Cutts et al. | |
| 7,272,613 B2 | 9/2007 | Sim et al. | |
| 7,636,724 B2 | 12/2009 | de la Torre et al. | |
| 2002/0062422 A1 | 5/2002 | Butterworth et al. | |
| 2002/0166079 A1 | 11/2002 | Ulrich et al. | |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0084020 A1 | 5/2003 | Shu | |
| 2004/0024963 A1 | 2/2004 | Talagala et al. | |
| 2004/0122917 A1 | 6/2004 | Menon et al. | |
| 2004/0215998 A1 | 10/2004 | Buxton et al. | |
| 2004/0228493 A1 | 11/2004 | Ma et al. | |
| 2005/0100022 A1 | 5/2005 | Ramprashad | |
| 2005/0114594 A1 | 5/2005 | Corbett et al. | |
| 2005/0125593 A1 | 6/2005 | Karpoff et al. | |
| 2005/0131993 A1 | 6/2005 | Fatula, Jr. | |
| 2005/0132070 A1 | 6/2005 | Redlich et al. | |
| 2005/0144382 A1 | 6/2005 | Schmisseur | |
| 2005/0229069 A1 | 10/2005 | Hassner | |
| 2006/0047907 A1 | 3/2006 | Shiga et al. | |
| 2006/0136448 A1 | 6/2006 | Cialini et al. | |
| 2006/0156059 A1 | 7/2006 | Kitamura | |
| 2006/0224603 A1 | 10/2006 | Correll, Jr. | |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0214285 A1 | 9/2007 | Au et al. | |
| 2007/0234110 A1 | 10/2007 | Soran et al. | |
| 2007/0283167 A1 | 12/2007 | Venters, III et al. | |
| 2009/0094251 A1 | 4/2009 | Gladwin et al. | |
| 2009/0094318 A1 | 4/2009 | Gladwin et al. | |
| 2010/0023524 A1 | 1/2010 | Gladwin et al. | |
| 2011/0265143 A1* | 10/2011 | Grube ................. | G06F 11/0727 726/2 |
| 2012/0054500 A1* | 3/2012 | Dhuse ................ | G06F 11/1076 713/189 |
| 2012/0137095 A1* | 5/2012 | Grube ................ | G06F 12/0638 711/162 |
| 2012/0311403 A1* | 12/2012 | Gladwin ............. | H04L 65/602 714/763 |
| 2013/0086450 A1* | 4/2013 | Grube ............... | H03M 13/3761 714/763 |
| 2014/0026017 A1* | 1/2014 | Grube ................ | G06F 11/1076 714/770 |
| 2014/0122968 A1* | 5/2014 | Kazi ...................... | G06F 11/10 714/763 |
| 2015/0101024 A1* | 4/2015 | Leggette ............. | H04L 67/1097 726/4 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

(56) References Cited

OTHER PUBLICATIONS

Zeilenga; Lightweight Directory Access Protocol (LDAP): Technical Specification Road Map; IETF Network Working Group; RFC 4510; Jun. 2006; pp. 1-8.
Zeilenga; Lightweight Directory Access Protocol (LDAP): String Representation of Distinguished Names; IETF Network Working Group; RFC 4514; Jun. 2006; pp. 1-15.
Sermersheim; Lightweight Directory Access Protocol (LDAP): The Protocol; IETF Network Working Group; RFC 4511; Jun. 2006; pp. 1-68.
Satran, et al.; Internet Small Computer Systems Interface (iSCSI); IETF Network Working Group; RFC 3720; Apr. 2004; pp. 1-257.
Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

\* cited by examiner

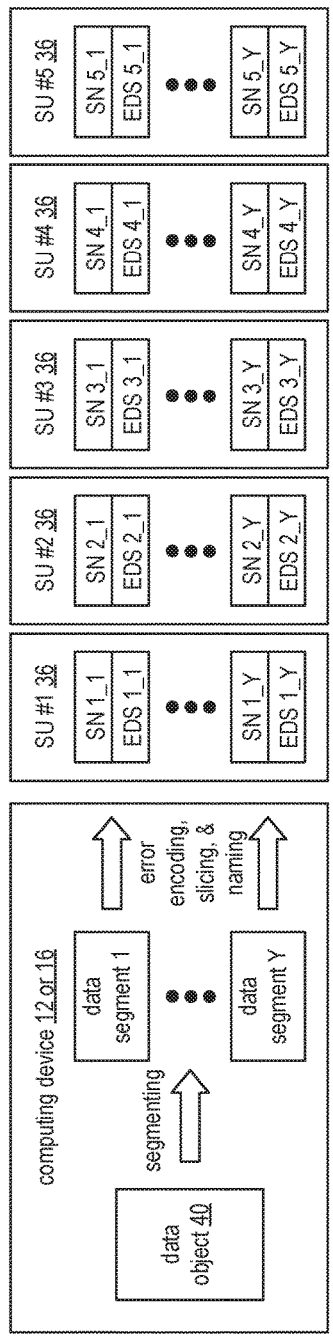
FIG. 3
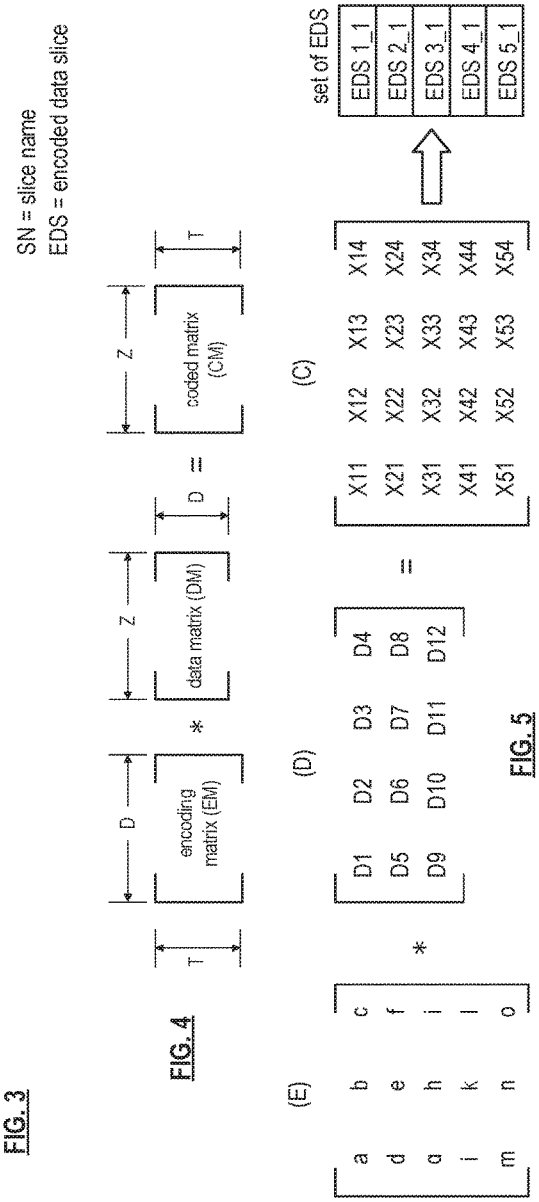
FIG. 4
FIG. 5
FIG. 6

QUASI-ERROR NOTIFICATIONS IN A DISPERSED STORAGE NETWORK

CROSS-REFERENCE TO RELATED APPLICATIONS

The present U.S. Utility Patent Application claims priority pursuant to 35 U.S.C. § 120 as a continuation-in-part of U.S. Utility Application Ser. No. 15/058,408, entitled "ACCESSING COMMON DATA IN A DISPERSED STORAGE NETWORK", filed Mar. 2, 2016, which claims priority pursuant to 35 U.S.C. § 119(e) to U.S. Provisional Application No. 62/154,886, entitled "BALANCING MAINTENANCE AND ACCESS TASKS IN A DISPERSED STORAGE NETWORK", filed Apr. 30, 2015, both of which are hereby incorporated herein by reference in their entirety and made part of the present U.S. Utility Patent Application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks, and more particularly to recovery of data from impaired storage units of a dispersed storage network.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on a remote storage system. The remote storage system may include a RAID (redundant array of independent disks) system and/or a dispersed storage system that uses an error correction scheme to encode data for storage.

In a RAID system, a RAID controller adds parity data to the original data before storing it across an array of disks. The parity data is calculated from the original data such that the failure of a single disk typically will not result in the loss of the original data. While RAID systems can address certain memory device failures, these systems may suffer from effectiveness, efficiency and security issues. For instance, as more disks are added to the array, the probability of a disk failure rises, which may increase maintenance costs. When a disk fails, for example, it needs to be manually replaced before another disk(s) fails and the data stored in the RAID system is lost. To reduce the risk of data loss, data on a RAID device is often copied to one or more other RAID devices. While this may reduce the possibility of data loss, it also raises security issues since multiple copies of data may be available, thereby increasing the chances of unauthorized access. In addition, co-location of some RAID devices may result in a risk of a complete data loss in the event of a natural disaster, fire, power surge/outage, etc.

BRIEF DESCRIPTION OF THE SEVERAL VIEWS OF THE DRAWING(S)

FIG. 3 is a schematic block diagram of an example of dispersed storage error encoding of data in accordance with the present disclosure;

FIG. 4 is a schematic block diagram of a generic example of an error encoding function in accordance with the present disclosure;

FIG. 5 is a schematic block diagram of a specific example of an error encoding function in accordance with the present disclosure;

FIG. 6 is a schematic block diagram of an example of slice naming information for an encoded data slice (EDS) in accordance with the present disclosure;

DETAILED DESCRIPTION OF THE INVENTION

Figure 1:
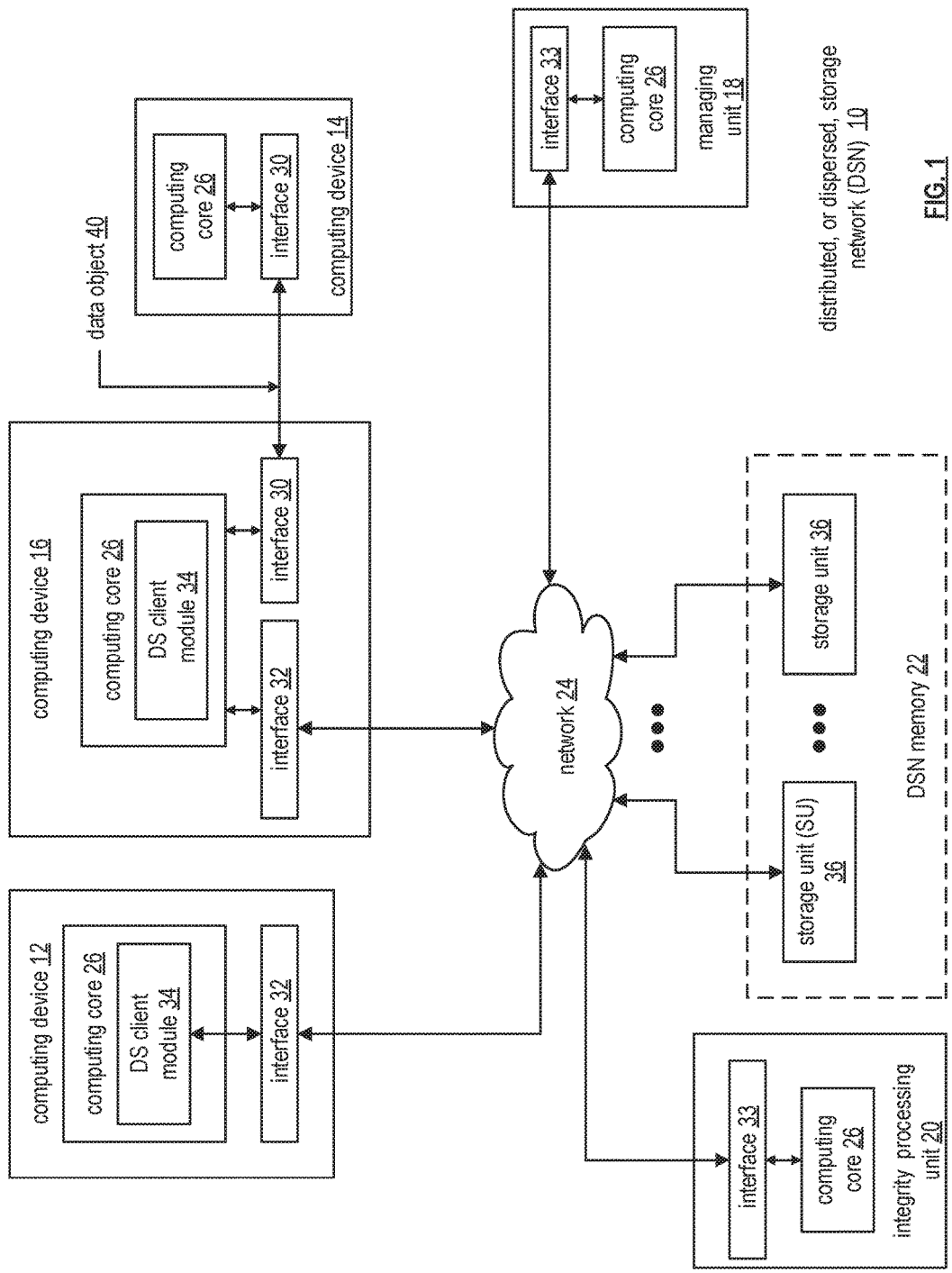
FIG. 1 is a schematic block diagram of an embodiment of a dispersed or distributed storage network (DSN) in accordance with the present disclosure.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
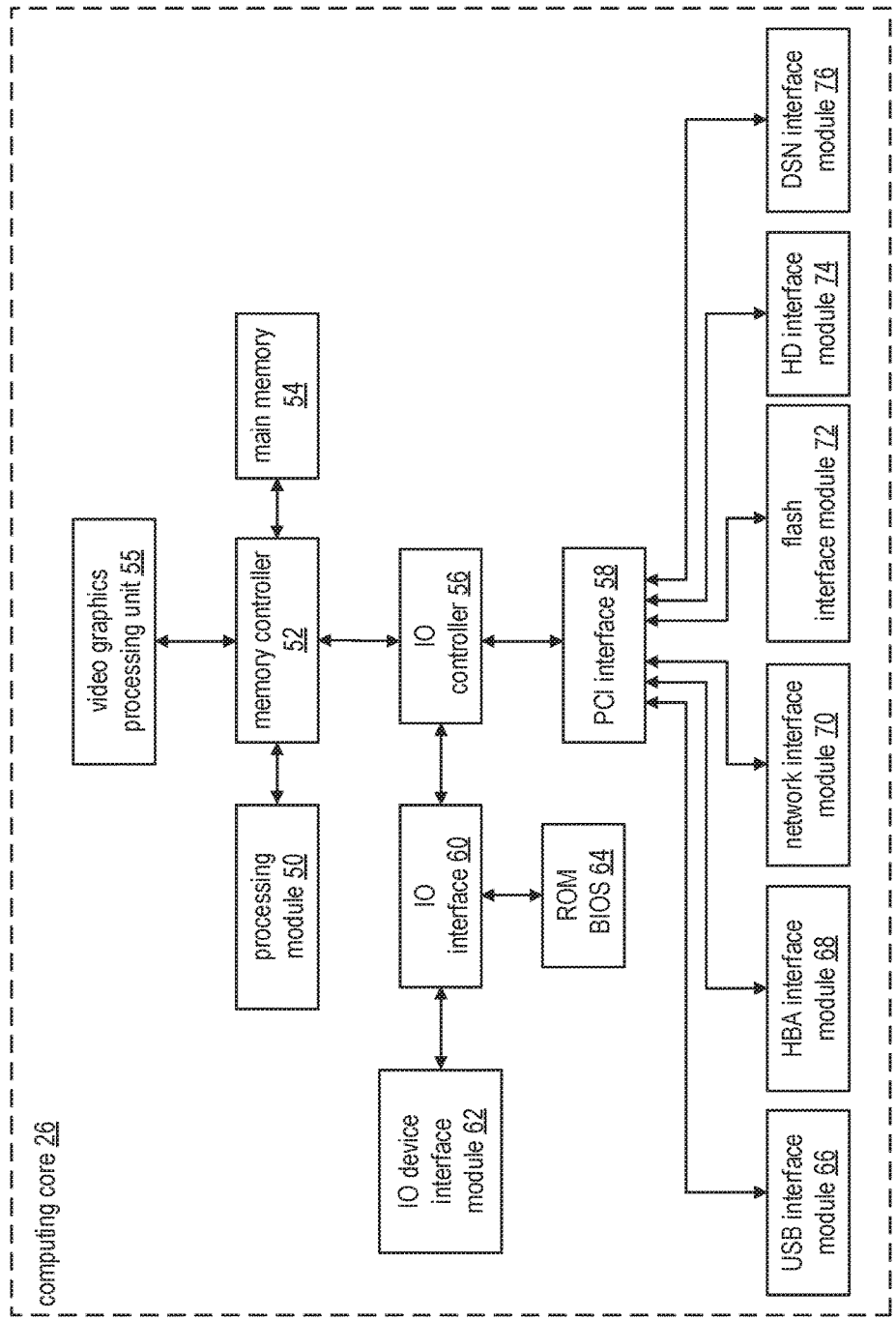
FIG. 2 is a schematic block diagram of an embodiment of a computing core in accordance with the present disclosure.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed storage (DS) error encoded data.

Each of the storage units 36 is operable to store DS error encoded data and/or to execute (e.g., in a distributed manner) maintenance tasks and/or data-related tasks. The tasks may be a simple function (e.g., a mathematical function, a logic function, an identify function, a find function, a search engine function, a replace function, etc.), a complex function (e.g., compression, human and/or computer language translation, text-to-voice conversion, voice-to-text conversion, etc.), multiple simple and/or complex functions, one or more algorithms, one or more applications, maintenance tasks (e.g., rebuilding of data slices, updating hardware, rebooting software, restarting a particular software process, performing an upgrade, installing a software patch, loading a new software revision, performing an off-line test, prioritizing tasks associated with an online test, etc.), etc.

Each of the computing devices 12-16, the managing unit 18, integrity processing unit 20 and (in various embodiments) the storage units 36 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32 and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data object 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate per-access billing information. In another instance, the managing unit 18 tracks the amount of data stored and/or retrieved by a user device and/or a user group, which can be used to generate per-data-amount billing information.

As another example, the managing unit 18 performs network operations, network administration, and/or network maintenance. Network operations includes authenticating user data allocation/access requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10. Examples of load balancing, service differentiation and dynamic resource selection for data access operations are discussed in greater detail with reference to FIGS. 9-13.

To support data storage integrity verification within the DSN 10, the integrity processing unit 20 (and/or other devices in the DSN 10) may perform rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. Retrieved encoded slices are checked for errors due to data corruption, outdated versioning, etc. If a slice includes an error, it is flagged as a 'bad' or 'corrupt' slice. Encoded data slices that are not received and/or not listed may be flagged as missing slices. Bad and/or missing slices may be subsequently rebuilt using other retrieved encoded data slices that are deemed to be good slices in order to produce rebuilt slices. A multi-stage decoding process may be employed in certain circumstances to recover data even when the number of valid encoded data slices of a set of encoded data slices is less than a relevant decode threshold number. The rebuilt slices may then be written to DSN memory 22. Note that the integrity processing unit 20 may be a separate unit as shown, included in DSN memory 22, included in the computing device 16, and/or distributed among the storage units 36.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), interne small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of five, a decode threshold of three, a read threshold of four, and a write threshold of four. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar width number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number. In the illustrated example, the value $X11=aD1+bD5+cD9$, $X12=aD2+bD6+cD10$, . . . $X53=mD3+nD7+oD11$, and $X54=mD4+nD8+oD12$.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as at least part of a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
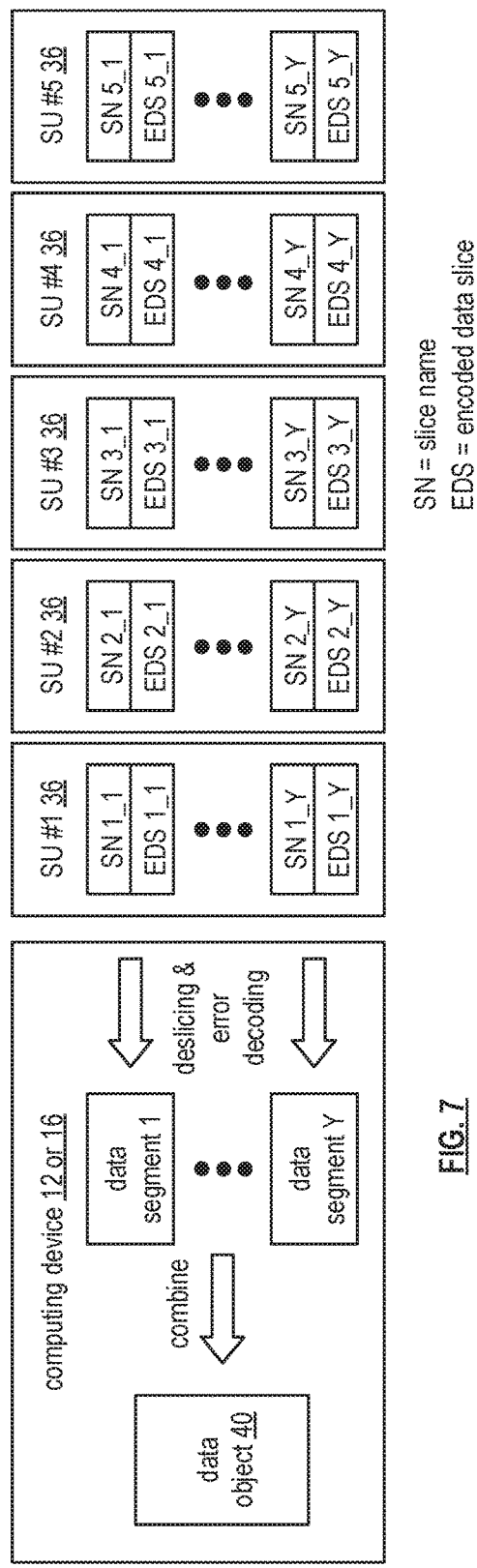
FIG. 7 is a schematic block diagram of an example of dispersed storage error decoding of data in accordance with the present disclosure.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
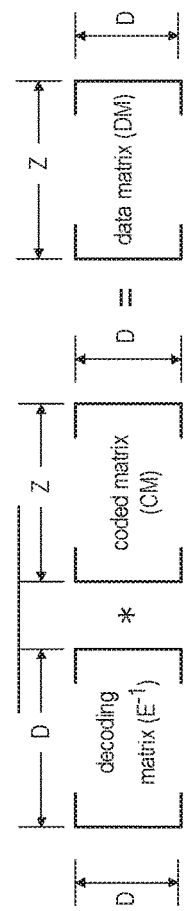
FIG. 8 is a schematic block diagram of a generic example of an error decoding function in accordance with the present disclosure.

In order to recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2 and 4, and then inverted to produce the decoding matrix.

Typically, when memory is quarantined or in an otherwise impaired state, the storage unit holding that memory may respond to a data access request by returning an error rather than service the request. Alternatively, the storage unit may attempt to service the request but do so very slowly (due to the impaired memory). Such actions may effectively delay processing of the data access request. As described more fully below in conjunction with the novel examples of FIGS. 9 and 10, a "quasi-error" response is introduced for use when retrieving data from an impaired memory. Briefly, an impaired storage unit may immediately return a quasi-error response to a data access request (e.g., a read data or write data request) involving impaired memory (e.g., memory that is not able to produce an encoded date slice in a relatively timely manner due to network conditions, degraded memory, heavy load conditions, maintenance operations, quarantine, etc.). A computing device receiving the quasi-error response may elect to issue a new data access request to another storage unit(s) and/or may issue a "continue request" command to the impaired storage unit such that the storage unit continues to attempt to process the data access request, even if a there is high probability of continued delay or failure.

In another example, a storage unit issuing a "quasi-error" response to a data access request may be configured to continue processing the request by default. During continued processing of the request by the impaired storage unit, a computing device receiving the quasi-error may concurrently attempt to recover impacted data (e.g., a threshold number of encoded data slices) from other storage units. If sufficient data is recovered from the other storage units, or the computing device otherwise determines that continued processing of the original data access request is unnecessary or undesirable, the computing device may issue a "cancel request" command to the impaired storage unit to stop processing of the data access request.

Figure 9:
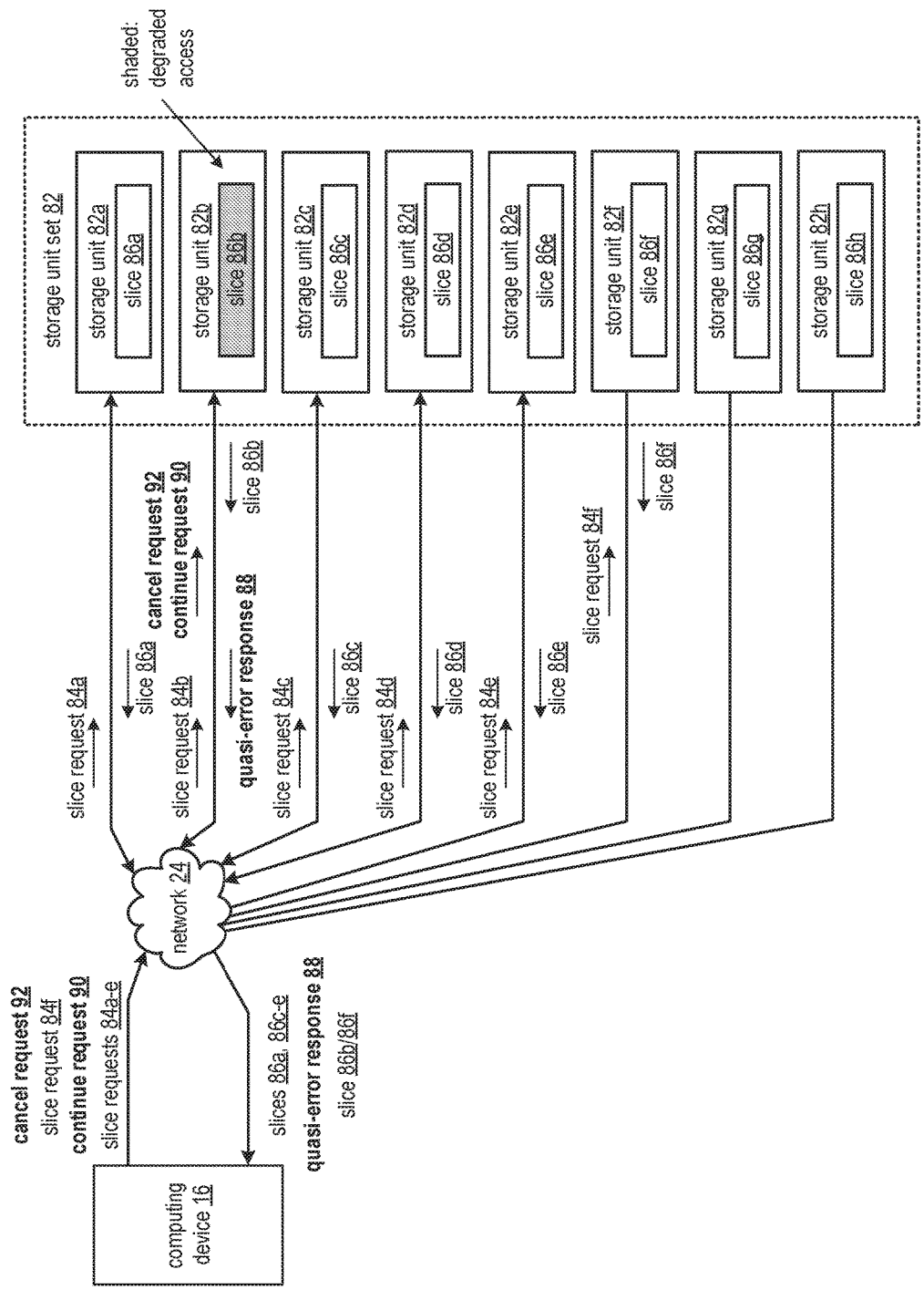
FIG. 9 is a schematic block diagram of another embodiment of a DSN performing recovery of stored data from an impaired storage unit in accordance with the present disclosure.

Referring now to FIG. 9, a schematic block diagram of another embodiment of a DSN performing recovery of stored data from an impaired storage unit in accordance with the present disclosure is shown. The illustrated DSN includes the computing device 16 of FIG. 1, the network 24 of FIG. 1, and a storage unit set 82. The storage unit set 82 includes a set of storage units 82a-82h. Each storage unit may be implemented utilizing the storage unit 36 of FIG. 1, and each of the storage units includes a DS client module 34, a processing module and memory (not separately illustrated). Hereafter, the storage unit set may be interchangeably referred to as a set of storage units. The storage units of a storage set may be located at a same physical location (site) or located at multiple physical locations without departing from the technology as described herein. The DSN functions to recover stored data when data retrieval is degraded.

The storage unit set 82 may include a number of storage units in accordance with dispersal parameters of a dispersed storage error coding function, where a data segment of data is dispersed storage error coded in accordance with the dispersed storage error coding function utilizing the dispersal parameters to create a set of encoded data slices. For example, the storage unit set 82 includes storage units 82a-82h when a width of the dispersal parameters is 8. The dispersal parameters further include a decode threshold number, where a decode threshold number (e.g., 5 when the width is 8) of encoded data slices of the set of encoded data slices is a minimum number of encoded data slices typically required to recover the data segment. The data that is encoded into the DS error encoded data may be of any size and/or of any content. For example, the data may be one or more digital books, a copy of a company's emails, a large-scale Internet search, a video security file, one or more entertainment video files (e.g., television programs, movies, etc.), data files, and/or indexing and key information for use in dispersed storage operations.

In an example of operation of the recovering of the stored data, the computing device 16 issues a decode threshold number of slice requests to storage units of the storage unit set 82. Issuing the slice requests may include one or more of receiving a retrieve data request, selecting the storage units, generating the read slice requests, and sending, via the network 24, the generated read slice requests to the selected storage units. For example, the computing device 16 generates and sends, via the network 24, slice requests 84a-84e to the storage units 82a-82e.

Having sent the slice requests, the computing device 16 receives responses within a response timeframe, where the responses includes less than a decode threshold number of encoded data slices and at least one quasi-error response. For example, the computing device 16 receives read slice responses from storage units 82a, 82c, 82d and 82e that include encoded data slices 86a, 86c, 86d and 86e, respectively, and receives a quasi-error response 88 from the impaired storage unit 82b when the storage unit 82b has impaired memory and is unable to immediately (e.g., within a relatively short period of time in relation to a typical response time of the storage unit) send the encoded data slice 86b to the computing device 16.

Having received the responses, the computing device 16 determines whether to utilize at least one other storage unit of the storage unit set (e.g., one of storage units 82f-82h). Such a determination may be based on one or more of: the number of error responses (e.g., quasi-error responses, slice unavailable responses); an estimated time to retrieve another encoded data slice; a timing requirement; and the number of other available storage units of the storage unit set. For example, the computing device 16 determines not to utilize another storage unit when receiving the quasi-error response with regards to the encoded data slice 86*b* and the storage units 82*f*-82*h* are determined to be offline or unreachable via the network 24.

When not utilizing another storage unit, the computing device 16 in one example issues at least one continue request to a storage unit corresponding to at least one quasi-error response. For example, the computing device 16 issues, via the network 24, a continue request 90 to the storage unit 82*b* with regards to the encoded data slice 86*b*. In response, the storage unit 82*b* continues to process the slice request (if not already doing so as described below) and proceeds to send, via the network 24, the encoded data slice 86*b* to the computing device 16. When the storage unit 82*b* is unable to retrieve the encoded data slice 86*b* (e.g., after a threshold amount of time has elapsed), storage unit 82*b* may send an error response to the computing device 16. When receiving the decode threshold number of encoded data slices, the computing device 16 disperse storage error decodes the decode threshold number of encoded data slices to reproduce a data segment of the data object of the retrieve data request.

Alternatively, or in addition to, the computing device 16 issues another slice request to another storage unit to produce the decode threshold number of encoded data slices. For example, the computing device 16 substantially simultaneously sends the continue request 90 to the storage unit 82*b* and sends a slice request 84*f* to the storage unit 82*f* (or a storage unit of another set of storage units if copies of the relevant encoded data slices are stored elsewhere) with regards to retrieving the encoded data slice 86*f*, receives at least one of the encoded data slice 86*b* and the encoded data slice 86*f* to complete the decode threshold number of encoded data slices, and disperse storage error decodes the decode threshold number of encoded data slices to reproduce the data segment. In another example, after issuing a quasi-error response, the storage units 82*a*-82*h* may be configured to automatically continue processing a data access request until a cancel request 92 is received or a final error response is issued (e.g., continued processing of slice request 84*b* by storage unit 82*b* is not contingent on receipt of continue request 90).

In another example of reading encoded data slices of a stored set of encoded data slices having a decode threshold number of 10 and a pillar width of 15, wherein 10 slice requests are issued to a set of 15 storage units and 9 data slices and 1 quasi-error response are received, a requesting device may determine to issue an additional slice request to one or more of the remaining 5 storage units. A continue request may also be issued to the impaired storage unit if it is not configured to automatically continue processing the slice relevant slice request, or a cancel request may be issued to stop processing of the slice request when an additional slice is available or likely to be available. If, however, the remaining 5 storage units are unavailable (e.g., offline), the requesting device will generally request continued processing of the slice request by the impaired storage unit (or refrain from issuing a cancel request) in an attempt to recover the decode threshold number of encoded data slices.

Figure 10:
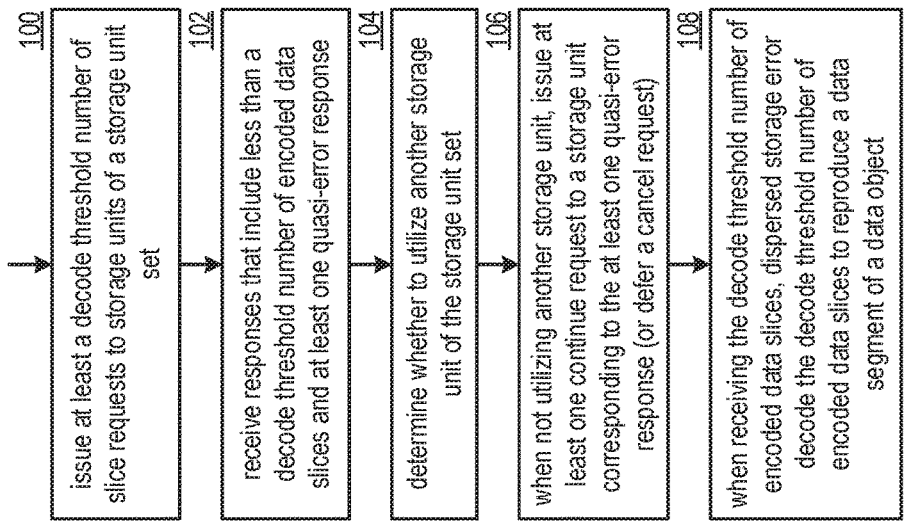
FIG. 10 is a logic diagram illustrating an example of recovery of stored data in accordance with the present disclosure when retrieval is degraded.

FIG. 10 is a logic diagram illustrating an example of recovery of stored data in accordance with the present disclosure when retrieval is degraded. The method includes step 100 where a processing module (e.g., of a computing device 16) issues at least a decode threshold number of slice requests to storage units of a storage unit set. For example, the processing module selects the storage units, generates the slice requests, and sends the slice requests to the selected storage units.

The method continues at step 102 where the processing module receives responses that include less than a decode threshold number of encoded data slices and at least one quasi-error response. The method continues at step 104 where the processing module determines whether to utilize another storage unit of the storage unit set. For example, the processing module determines not to utilize another storage unit when a calculated probability of recovering an incremental encoded data slice from the other storage unit is a calculated probability of recovering an encoded data slice from a storage unit associated with the at least one quasi-error response, or the calculated probability of recovering an encoded data slice from a storage unit associated with the at least one quasi-error response is lower than threshold value. Alternatively, the processing module determines not to utilize another storage unit when slice requests were initially issued to all storage units of a storage set.

When not utilizing another storage unit, the method continues at step 106 where the processing module issues at least one continue request to the storage unit corresponding to the at least one quasi-error response (or, alternatively, defers issuing a cancel request when the storage unit is configured to automatically continue processing a slice request after issuing a quasi-error). For example, the processing module identifies the storage unit, generates the continue request (e.g., to include a status code for the continue request and a slice name associated with encoded data slice), and sends the continue request to the identified storage unit. When receiving the decode threshold number of encoded data slices, the method continues at step 108 where the processing module dispersed storage error decodes the decode threshold number of encoded data slices to reproduce a data segment of a data object for retrieval.

The methods described above in conjunction with the computing device 16 and storage units can alternatively be performed by other modules (e.g., DS client modules 34) of a dispersed storage network or by other devices (e.g., managing unit 18 or integrity processing unit 20). Any combination of a first module, a second module, a third module, a fourth module, etc. of the computing devices and the storage units may perform the method described above. In addition, at least one memory section (e.g., a first memory section, a second memory section, a third memory section, a fourth memory section, a fifth memory section, a sixth memory section, etc. of a non-transitory computer readable storage medium) that stores operational instructions can, when executed by one or more processing modules of one or more computing devices and/or by the storage units of the dispersed storage network (DSN), cause the one or more computing devices and/or the storage units to perform any or all of the method steps described above.

As may be used herein, the terms "substantially" and "approximately" provides an industry-accepted tolerance for its corresponding term and/or relativity between items. Such an industry-accepted tolerance ranges from less than one percent to fifty percent. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/ or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information. A computer readable memory/storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method for execution by one or more processing modules of one or more computing devices of a dispersed storage network (DSN), the DSN including a set of storage units storing encoded data, the method comprises:
   issuing slice requests to a plurality of storage units of the set of storage units for at least a decode threshold number of encoded data slices of a set of encoded data slices, wherein segments of a data object are dispersed storage error encoded to produce a plurality of sets of encoded data slices including the set of encoded data slices, and wherein a decode threshold number of encoded data slices of the set of encoded data slices is required to recover a corresponding data segment;
   receiving a plurality of responses from the plurality of storage units, wherein the plurality of responses include less than the decode threshold number of encoded data slices and at least one quasi-error response from an impaired storage unit;
   based on the at least one quasi-error response, determining to issue at least one of:
      a continue request to the impaired storage unit, the continue request requesting continued processing of a slice request received by the impaired storage unit and corresponding to the quasi-error response; or
      an additional slice request to an additional storage unit of the set of storage units, the additional slice request requesting an additional encoded data slice of the set of encoded data slices; and
   issuing the continue request to the impaired storage unit or the additional slice request to the additional storage unit.

2. The method of claim 1 further comprises:
   receiving the decode threshold number of encoded data slices in response to the continue request or the additional slice request; and
   dispersed storage error decoding the decode threshold number of encoded data slices to recover the corresponding data segment.

3. The method of claim 1, wherein determining to issue at least one of a continue request or an additional slice request is based on at least one of:
   a number of quasi-error responses received from the plurality of storage units of the set of storage units; or
   a number of additional storage units of the set of storage units to which a slice request was not issued.

4. The method of claim 1, wherein determining to issue at least one of a continue request or an additional slice request is based on at least one of:
   determining that a calculated probability of receiving an encoded data slice from the impaired storage unit is below a threshold level; or
   determining that a calculated probability of receiving an encoded data slice from the additional storage unit is greater than a calculated probability of receiving an encoded data slice from the impaired storage unit.

5. The method of claim 1, wherein determining to issue at least one of a continue request or an additional slice request is based on at least one of:
   an estimated time to retrieve an encoded data slice from the additional storage unit; or
   a timing requirement.

6. The method of claim 1, wherein the continue request, when issued, includes a status code and a slice name of an encoded data slice.

7. The method of claim 1, wherein issuing slice requests to the plurality of storage units of the set of storage units includes:
   receiving a retrieve data request associated with the data object; and
   selecting the plurality of storage units based on the retrieve data request.

8. The method of claim 1, wherein determining to issue at least one of a continue request or an additional slice request includes determining to issue both the continue request and the additional slice request.

9. A computing device of a group of computing devices of a dispersed storage network (DSN), the DSN including a set of storage units storing encoded data, the computing device comprises:
   a network interface;
   a local memory; and
   a processing module operably coupled to the network interface and the local memory, wherein the processing module is configured to:
      issue, via the network interface, slice requests to a plurality of storage units of the set of storage units for at least a decode threshold number of encoded data slices of a set of encoded data slices, wherein segments of a data object are dispersed storage error encoded to produce a plurality of sets of encoded data slices including the set of encoded data slices, and wherein a decode threshold number of encoded data slices of the set of encoded data slices is required to recover a corresponding data segment;

receive, via the network interface, a plurality of responses from the plurality of storage units, wherein the plurality of responses include less than the decode threshold number of encoded data slices and at least one quasi-error response from an impaired storage unit;

based on the at least one quasi-error response, determine to issue an additional slice request to an additional storage unit of the set of storage units, the additional slice request requesting an additional encoded data slice of the set of encoded data slices; and issue, via the network interface, the additional slice request to the additional storage unit.

10. The computing device of claim 9, wherein the processing module is further configured to:

receive, via the network interface, the decode threshold number of encoded data slices in response to the additional slice request; and dispersed storage error decode the decode threshold number of encoded data slices to recover the corresponding data segment.

11. The computing device of claim 10, wherein the processing module is further configured to:

issue, via the network interface, a cancel request to the impaired storage unit, the cancel request requesting discontinued processing of a slice request received by the impaired storage unit.

12. The computing device of claim 9, wherein determining to issue an additional slice request is based on at least one of:

a number of quasi-error responses received from the plurality of storage units of the set of storage units; or a number of additional storage units of the set of storage units to which a slice request was not issued.

13. The computing device of claim 9, wherein determining to issue an additional slice request is based on at least one of:

determining that a calculated probability of receiving an encoded data slice from the impaired storage unit is below a threshold level; or determining that a calculated probability of receiving an encoded data slice from the additional storage unit is greater than a calculated probability of receiving an encoded data slice from the impaired storage unit.

14. The computing device of claim 9, wherein determining to issue an additional slice request is based on at least one of:

an estimated time to retrieve an encoded data slice from the additional storage unit; or a timing requirement.

15. The computing device of claim 9, wherein issuing slice requests to the plurality of storage units of the set of storage units includes:

receiving, via the network interface, a retrieve data request associated with the data object; and selecting the plurality of storage units based on the retrieve data request.

16. The computing device of claim 9, wherein determining to issue an additional slice request further includes:

determining to issue, via the network interface, a continue request to the impaired storage unit, the continue request requesting continued processing of a slice request received by the impaired storage unit and corresponding to the quasi-error response.

17. A storage unit of a set of storage units of a dispersed storage network (DSN), the DSN including a computing device, storage unit comprises:

a network interface;

a memory device, the memory device storing an encoded data slice of a set of encoded data slices, wherein segments of a data object are dispersed storage error encoded to produce a plurality of sets of encoded data slices including the set of encoded data slices; and a processing module operably coupled to the network interface and the memory device, wherein the processing module is configured to:

receive, via the network interface, a slice request from the computing device for the encoded data slice;

process the slice request to determine whether the encoded data slice is immediately available to send to the computing device; and in response to determining that the encoded data slice is immediately available, retrieve the encoded data slice from the memory device and send, via the network interface, the encoded data slice to the computing device, and in response to determining that the encoded data slice is not immediately available, send, via the network interface, a quasi-error response to the computing device.

18. The storage unit of claim 17, the processing module further configured to:

receive, via the network interface, a continue request in reply to the quasi-error response; and in response to the continue request, continue processing of the slice request.

19. The storage unit of claim 18, the processing module further configured to:

receive, via the network interface, a cancel request in reply to the quasi-error response; and in response to the cancel request, discontinue processing of the slice request.

20. The storage unit of claim 18, wherein continued processing of the slice request includes:

determining that the encoded data slice is unavailable from the memory device; and sending, via the network interface, an error response to the computing device.

* * * * *